United States Patent
Perugupalli et al.

(10) Patent No.: US 7,564,303 B2
(45) Date of Patent: Jul. 21, 2009

(54) SEMICONDUCTOR POWER DEVICE AND RF SIGNAL AMPLIFIER

(75) Inventors: Prasanth Perugupalli, Gilbert, AZ (US); Stan Lopuch, St. James, NY (US); Nagaraj V. Dixit, Gilbert, AZ (US)

(73) Assignee: Infineon Technologies AG, Munich (DE)

( * ) Notice: Subject to any disclaimer, the term of this patent is extended or adjusted under 35 U.S.C. 154(b) by 825 days.

(21) Appl. No.: 11/189,498

(22) Filed: Jul. 26, 2005

(65) Prior Publication Data

US 2007/0024358 A1      Feb. 1, 2007

(51) Int. Cl.
*H03F 1/00*    (2006.01)
(52) U.S. Cl. .......................................... 330/66; 330/307
(58) Field of Classification Search .................... 330/66, 330/307, 309
See application file for complete search history.

(56) References Cited

U.S. PATENT DOCUMENTS

| | | | |
|---|---|---|---|
| 5,488,252 A * | 1/1996 | Johansson et al. ............ 257/579 |
| 6,099,677 A | 8/2000 | Logothetis et al. .......... 156/253 |
| 6,177,834 B1 | 1/2001 | Blair et al. .................. 327/566 |
| 6,414,389 B1 * | 7/2002 | Hume et al. ................. 257/732 |
| 6,466,094 B2 | 10/2002 | Leighton et al. ............ 330/302 |
| 6,614,308 B2 * | 9/2003 | Moller et al. ............... 330/295 |
| 6,734,728 B1 * | 5/2004 | Leighton et al. .............. 330/66 |
| 6,777,791 B2 | 8/2004 | Leighton et al. ............ 257/678 |

* cited by examiner

*Primary Examiner*—Henry K Choe
(74) *Attorney, Agent, or Firm*—Coats & Bennett, P.L.L.C.

(57) ABSTRACT

A semiconductor power device comprises a flange, a die having a gate, a source, and a drain. The source is electrically coupled to the flange. A drain matching circuit is located on the flange having an input, an output and a bias input, the input being coupled with the drain. The drain matching circuit comprises an inductor coupled in series with a first capacitor between the drain and flange and a second capacitor arranged next to the first capacitor, wherein the second capacitor is coupled with the bias input and in parallel with the first capacitor through a second inductor. An input terminal is mechanically coupled to the flange and electrically coupled with the gate, an output terminal is mechanically coupled to the flange and electrically coupled with the output of the drain matching circuit, and an input bias terminal is mechanically coupled to the flange and electrically coupled with the drain through the bias input.

41 Claims, 10 Drawing Sheets

US 7,564,303 B2

SEMICONDUCTOR POWER DEVICE AND RF SIGNAL AMPLIFIER

TECHNICAL FIELD

The present invention generally relates to the field of radio frequency (RF) power transistor devices and RF signal amplifiers and, more specifically, to biasing structures for an RF power transistor.

BACKGROUND

RF power transistor devices are generally known for use as signal amplifiers in wireless communication applications. As demand for wireless communication applications has increased, the operating frequency for wireless networks has also increased. Operating frequencies now span well into the gigahertz range.

Variables in individual transistor elements contributed by inherent parasitics pose a big challenge for mass production of RF power transistors problematic. Transistor devices naturally vary as to input capacitance, gain and phase shift. Particular transistor devices are preliminarily characterized over a range of expected operating frequencies and voltages. In particular, parasitic elements of an RF power transistor cause inherent non-linearities to the respective transistor. RF power amplifiers for 3rd generation base stations are designed to operate with an approximately 4 MHz wide spread spectrum Wideband Code Division Multiple Access (W-CDMA) format and may be used with one, or any combination of, two to four carriers. In any case, the maximum expected instantaneous spread-spectrum bandwidth is about 20 MHz.

This coincides with the 20 MHz wide sub-bands of the Universal Mobile Telecommunication System (UMTS) or Personal Communication Services (PCS) spectrums. These spectra are 60 MHz wide, to facilitate different service providers operating simultaneously in their respective allocated sub-bands.

In order to speed up the implementation of these 3rd generation networks, there is an increased interest among operators in sharing "common" infrastructure elements, including the base stations with their RF power amplifiers and antennae. Such a solution has already been allowed by European regulatory agencies.

In such a scenario, one can envision operation of the base station power amplifier with signals present in different sub-bands simultaneously. Consequently, although each operator is confined to his allocation, the actual bandwidth of the spread-spectrum signals may reach 60 MHz.

The non-linearities of an RF power transistor, as mentioned above, are enhanced by the effect of internal and external matching networks designed to optimize power transfer from the transistor. This phenomenon is detrimental to the wideband linear performance of the amplifier.

The bias circuitry used to deliver the DC power to the transistor, in addition to the elements to suppress the lower frequency spurious generation, is known to interact with the RF matching circuit and affect the operating/video bandwidth of the device, manifesting itself in degradation of both power transfer and the wideband linearity of the device. Such a matching circuit is known, for example, from U.S. Pat. No. 6,734,728 the entire content of which is hereby incorporated by reference.

U.S. Pat. No. 6,734,728 shows an example for a RF power transistor with a shunt network. Such implementation resolves some of the problems associated with the wideband performance of an RF power transistor. Such a method improves the video bandwidth of the transistor from about 15-20 MHz up to about 40-45 MHz.

SUMMARY

According to one aspect of the invention, a semiconductor power device comprises a flange, a die having a gate, a source, and a drain, wherein the source is electrically coupled to the flange, a drain matching circuit located on the flange having an input, an output and a bias input, the input being coupled with the drain, wherein the drain matching circuit comprises an inductor coupled in series with a first capacitor between the drain and flange and a second capacitor arranged next to the first capacitor, wherein the second capacitor is coupled with the bias input and in parallel with the first capacitor through a second inductor, an input terminal being mechanically coupled to the flange and electrically coupled with the gate, an output terminal being mechanically coupled to the flange and electrically coupled with the output of the drain matching circuit, and an input bias terminal being mechanically coupled to the flange and electrically coupled with the drain through the bias input.

The value of the second capacitor can be large in comparison to the first capacitor and the distance between the first capacitor and the second capacitor can be small, wherein a coupling bond wire creates a small inductance. The device may further comprise a gate matching circuit located on the flange having an input and an output, the output being coupled to the gate, an input bias terminal being mechanically, coupled to the flange and electrically coupled with the gate through said gate matching circuit. The die can be a LDMOS transistor. The gate matching network may comprise two T network and a shunt network. The bias input terminal can be coupled with a respective shunt network through a T network. Each T network may comprises a first and second bond wire coupled in series and a capacitor coupled between the connection of the bond wires and source. The device may further comprise an input blocking capacitor being electrically coupled between the input terminal and the gate. The blocking capacitor can be located on the proximal end of the input terminal. The device may further comprise an output blocking capacitor being electrically coupled between the output terminal and the drain. The blocking capacitor can be located on the proximal end of the output terminal. A plurality of dies, a plurality of gate matching circuits and a plurality of drain matching circuits can be provided. The input of the drain matching network can be coupled with the output of the drain matching network through an inductor. The bias input of the drain matching network can be coupled with the input bias terminal through an inductor. The inductors can be formed by a bond wire. The first inductor may have a value of about 200 pH, and the first capacitor may have a value of about 200 pF, the second inductor may have a value of about 100 pH, and the second inductor may have a value of about 10 nF.

A broadband radio frequency (RF) signal amplifier comprises at least one transistor attached to a surface of a pedestal, the transistor having a RF input and a RF output, a bias input and a bias output, wherein the pedestal comprises a support structure, reference ground and heat sink for the transistor, an RF input path electrically connected to the transistor input, an input matching network configured to couple the input signal to the transistor input at an input impedance, an input direct current (dc) bias network configured to bias the transistor input to an input operating point, an RF output path electrically connected to the transistor output, and an output matching network configured to couple the respective component output signal to the transistor output at an output impedance, and an output dc bias networks configured to bias the transistor output to an output operating point, wherein the output dc bias network comprises an inductor coupled in series with a first capacitor between the drain and reference ground and a second capacitor arranged next to the first capacitor, wherein the second capacitor is coupled with the bias input and in parallel with the first capacitor through a second inductor.

Again, the value of the second capacitor may be large in comparison to the first capacitor and the distance between the first capacitor and the second capacitor can be small, wherein a coupling bond wire creates a small inductance. A plurality of transistors can be provided on the pedestal and wherein the input path includes a splitter configured to split a RF input signal into a plurality of component input signals. The output path may include a signal merger configured to combine component output signals received at the transistor outputs into a RF output signal. The inductors can be formed by bond wires. The input matching network may comprise a transmission line implemented in a printed circuit board and electrically connecting the component input signals to respective transistor inputs, the transmission lines having lengths, approximating one-fourth of a wavelength of a fundamental frequency of the RF input signal. The output matching network may comprise transmission lines implemented in a printed circuit board and electrically connecting component output signals to the combiner, the transmission lines having lengths approximating one-fourth of a wavelength of a fundamental frequency of the RF input signal. The signal splitter and signal merger can be passive elements. The input impedance can be relatively high, and the input operating point can be relatively low. The amplifier may further comprise a first plurality of conductors electrically connecting respective input, path transmission lines to respective transistor inputs, and a second plurality of conductors electrically connecting respective output path transmission lines to respective transistor outputs.

Another semiconductor power device comprises a flange, a die having a gate, a source, and a drain, wherein the source is electrically coupled to the flange, a gate matching circuit located on the flange having an input and an output, the output being coupled to the gate, an input bias terminal being mechanically, coupled to the flange and electrically coupled with the gate through said gate matching circuit, and a drain matching circuit located on the flange having an input, an output and a bias input, the input being coupled with the drain, wherein the drain matching circuit comprises an inductor coupled in series with a first capacitor between the drain and flange and a second capacitor arranged next to the first capacitor, wherein the second capacitor is coupled with the bias input and in parallel with the first capacitor through a second inductor, and wherein the value of the second capacitor is large in comparison to the first capacitor and the distance between the first capacitor and the second capacitor is small, wherein a coupling bond wire creates a small inductance, an input terminal being mechanically coupled to the flange and electrically coupled with the gate, an output terminal being mechanically coupled to the flange and electrically coupled with the output of the drain matching circuit, and an input bias terminal being mechanically coupled to the flange and electrically coupled with the drain through the bias input.

The gate matching network may comprises two T network and a shunt network. The bias input terminal can be coupled through a T network with the shunt network. Each T network may comprise a first and second bond wire coupled in series and a capacitor coupled between the connection of the bond wires and source. The semiconductor power device may further comprise an input blocking capacitor being electrically coupled between the input terminal and the gate. The blocking capacitor can be located on the proximal end of the input terminal. The semiconductor power device may further comprise an output blocking capacitor being electrically coupled between the output terminal and the drain. The blocking capacitor can be located on the proximal end of the output terminal. A plurality of dies, a plurality of gate matching circuits and a plurality of drain matching circuits can be provided. The input of the drain matching network can be coupled with the output of the drain matching network through an inductor. The inductors can be formed by a bond wire. The bias input of the drain matching network can be coupled with the input bias terminal through an inductor. The first inductor may again have a value of about 200 pH, the first capacitor of about 200 pF, the second inductor of about 100 pH, and the second inductor of about 10 nF.

The objects, features, and advantages of the present invention will be readily apparent to those skilled in the art upon a reading of the description of the preferred embodiments that follows.

BRIEF DESCRIPTION OF THE DRAWINGS

The present invention is better understood by reading the following description of non-limiting embodiments with reference to the attached drawings wherein like parts of each of the several figures are identified by the same referenced characters, and which are briefly described as follows.

It is to be noted, however, that the appended drawings illustrate only a few aspects of certain embodiments of this invention and are therefore not limiting of its scope, as the invention encompasses equally effective additional or equivalent embodiments.

DETAILED DESCRIPTION

Figure 1:
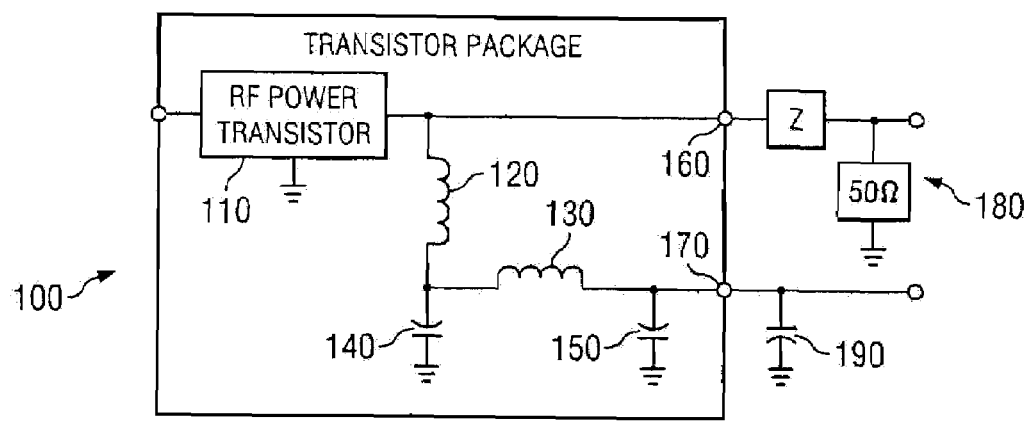
FIG. 1 is a schematic diagram showing a general embodiment of an output matching network for an LDMOS RF power transistor device.

FIG. 1 shows output path and output matching elements of the interior of an RF power transistor package 100 including an RF power transistor 110. The input matching network is not shown in this figure. The drain of RF power transistor 110 is coupled with a first external terminal 160 and includes a drain or output matching network comprising a first inductor 120 coupled in series with a first capacitor 140 with ground. The node between the first inductor 120 and the first capacitor 140 is furthermore coupled through a second inductor 130 with a second external output terminal 170. The capacitor 150 is physically placed very close to capacitor 140. Thus, these two capacitors 140 and 150 are coupled in parallel through a very small inductor 130. Generally, capacitor 150 is very large compared to capacitor 140. The node between the second inductor 130 and the second output terminal 170 is coupled with ground through a second capacitor 150. External termination network 180 coupled with the first terminal 160 is also shown. The second terminal 170 serves as a DC bias input and comprises usually a large external capacitor 190 for suppressing low frequency components.

This specific internal structure of the matching elements and the external DC bias circuitry are selected and arranged to maximize the power transfer of an RF power transistor while maximizing the wideband performance of the device. LDMOS transistors are usually used as RF power transistors. As known in the prior art, these transistors use a shunt inductor 120 to resonate the drain-to-source output capacitance $C_{ds}$. According to the exemplary embodiment shown in FIG. 1, the inductor 120 is physically placed directly outside the active semiconductor device of the transistor but still within the traditional transistor package. This inductor 130 also provides the path for the DC bias voltage. The value of this inductor is rather small because its function is to resonate at $f_0$. As will be appreciated by a person skilled in the art, such an inductor 120 may serve well in a so called video frequency filter block formed by capacitor 150 and inductor 130. The video filtering capacitor is placed in parallel and next to the DC capacitor 140 within the housing. Both capacitors 140 and 150 are separated only by a small inductor 130 which basically represents the physically realizable connection, such as a bond wire. The drain bias is connected from the outside of the package on a separate lead to the capacitor 150 and consequently to the drain terminal via inductors 130 and 120.

Figure 2:
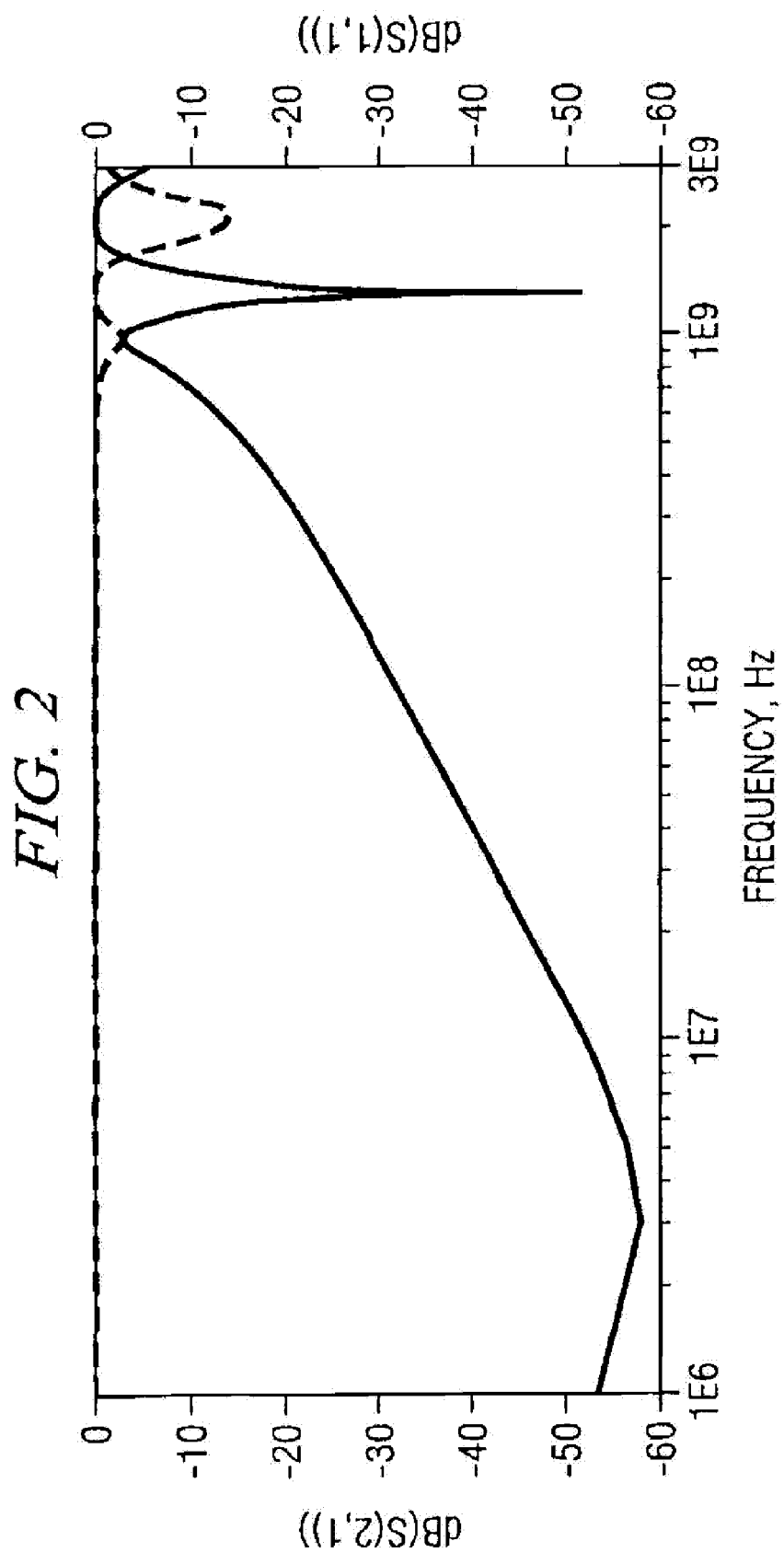
FIG. 2 is a diagram showing the frequency response of a transistor as shown in FIG. 1.

FIG. 2 shows a frequency response of an exemplary embodiment of the circuit as shown, for example, in FIG. 1. Exemplary values for the different elements are, for example, around 200 pH for inductor 120, here in particular 211 pH and 0.01Ω, around 200 pF for capacitor 140, here in particular 215 pF, around 100 pH for inductor 130, and around 10 nF for capacitor 150. The external capacitor 190 may have, for example, a value of around 10 μF, and the network 180 may comprise a microstrip transmission line with a resistance of 15.81Ω and ¼ lambda at the resonance frequency as well as a 50Ω termination resistor. The frequency response shows a secondary peak which is at 1 GHz. Thus, the circuit provides more than 30 dB of attenuation at 100 MHz and below. The position of the secondary peak depends on the value of inductor 130. It must be very small, which means that capacitor 150 must be physically next to capacitor 140. For example, a 1 nH inductor instead of the proposed 0.1 nH inductor 130 would shift the secondary peak down to a frequency of 300 MHz and decrease the attenuation at 100 MHz to 20 dB.

Figure 3:
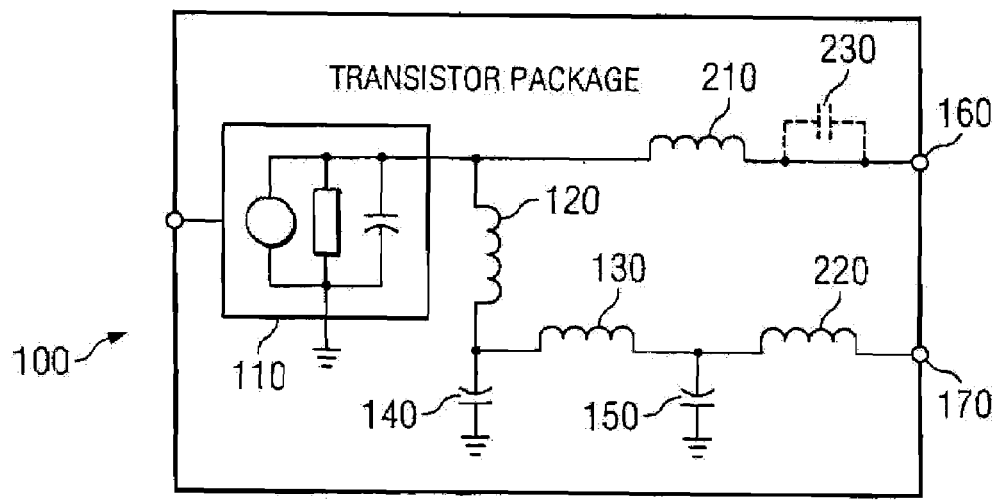
FIG. 3 is a schematic circuit diagram of another exemplary embodiment of an LDMOS RF power transistor device.

FIG. 3 shows an exemplary embodiment according to the concept as shown in FIG. 1. Same elements carry the same numerals. Additional inductors 210 and 220 are included in this embodiment because these additional inductors are created by the connection wires used to couple the internal matching structure with the output terminals 160 and 170 respectively. In addition an output coupling capacitor 230 is indicated by dotted lines for coupling bond wire 210 with output terminal 160. FIG. 3 shows the intrinsic LDMOS power transistor via substitute elements voltage source, internal resistor and capacitance. The coupling of the drain with the external terminal 160 is provided by inductor 210 which represents, for example, a respective bond wire. The coupling of the node between capacitor 150 and inductor 130 and terminal 170 is provided by inductor 220 created, for example, by a respective bond wire.

Figure 4:
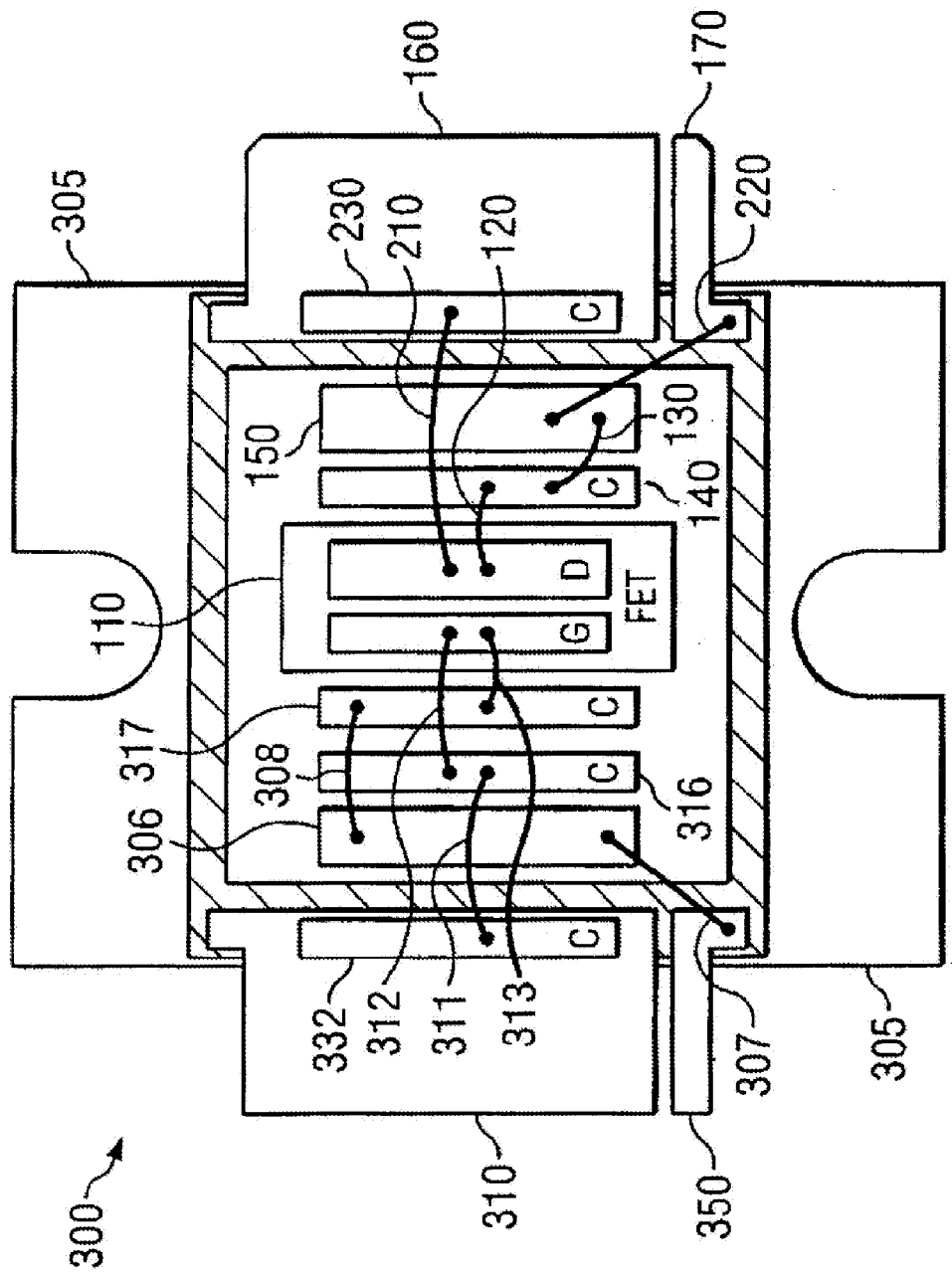
FIG. 4 is a top view of a LDMOS RF power transistor device similar to the embodiment shown in FIG. 3.

A physical embodiment of such an equivalent circuit as shown in FIG. 3 is depicted, for example, in FIG. 4. Similar to the prior art transistor as shown in FIG. 4A of U.S. Pat. No. 6,734,728, this power transistor 300 comprises a flange 305 with a pedestal for providing mechanical support for all connectors and elements within the package as well as for electrical grounding. Also a printed circuit board may be used to provide support and connectivity for the different devices. The pedestal can serve as such a circuit board. The device may form a broadband RF signal amplifier and comprises an input terminal 310, an output terminal 160, a field effect transistor die 110, a gate matching network, and a drain matching network. The gate matching network is formed in an equivalent way to the output matching network with respect to the bias feed. Thus, additional capacitor 306 is arranged within the housing on the input side. The bias feed terminal 350 is coupled through bond wire 307 with this additional input feed capacitor 306. This bond wire 307 forms another inductor. Capacitor 306 is coupled with capacitor 317 through inductor/bond wire 308 with capacitor 317, similar to the bias arrangement in the output circuit.

The field effect transistor die 110 is preferably an LDMOS device. The die 110 is bonded to a flange 305, thereby thermally and mechanically coupling the die 110 to the flange and electrically coupling the source to the flange 305. This transistor 300 has an input bias terminal 350 and an output bias terminal 170, making transistor 300 a five terminal device such as an RF signal amplifier. In the figures and text that follow, the transistor die is illustrated to be an LDMOS device, a skilled practitioner will appreciate that there are numerous other die type choices which will produce an acceptable amplifier.

In addition, it is to be noted that the transistor 300 has an input DC blocking capacitor 332 and output DC blocking capacitor 230. Input blocking capacitor 332 has its first terminal bonded to the input terminal 310 at a location proximal to the die 110 and its second terminal electrically coupled to the gate of the die 110. Output blocking capacitor 230 has its first terminal bonded to the output terminal 320 at a location proximal to the die 110 and its second terminal electrically coupled to the drain of the die 110.

Bond wires are used to electrically couple components of transistor 300. These bond wires have a self-inductance that, in many cases, cannot be neglected at typical frequencies of operation. Bond wires are used to electrically couple the gate of the die 110 to the input terminal 310 through input blocking capacitor 332, and to electrically couple the drain of the die 110 to the output terminal 160 through output blocking capacitor 230. To lower the resistance of certain bond wires, a plurality of such bond wires can be used in parallel (not shown in the Figures). A gate matching network is required to effectively couple RF power coming from the RF feed to the gate of the die 110. Similarly, a drain matching network is also required to effectively couple RF power coming from the drain of the die 110 to the RF output and load. As stated above, the gate matching network is improved in the same way as the drain matching network.

The gate matching network provides compensation for the bond wire inductors, as well as the input capacitance associated with the gate of the die 110. The gate matching network includes a "T-network," and a "shunt network." The T-network includes a first bond wire inductance 311 coupled to the input blocking capacitor 332, a second bond wire inductance 312 coupled to the gate of the die 110, and a first input capacitor 316 coupled to ground on the flange 305, each coupled to a central node. The shunt network includes a third bond wire inductance 307 coupled to a second input capacitance 306 which is coupled with a third input capacitance 317 of relatively high capacitance through fourth bond wire 308. Third input capacitance 317 is a blocking capacitor, which prevents the inductances 307/308 from shorting the DC bias at the gate of the die 319 to ground. The bond wire inductances 307/308 are coupled to the gate of die 110 through bond wire 313, and the second and third input capacitors 306 and 317 are coupled to ground on the flange 305.

The T-network transforms the impedance "looking" into the transistor input terminal 310 at the operating frequency to match the output impedance of line (not shown) connected to terminal 310. The shunt network provides resonance at the fundamental signal frequency, while negating gate reactance.

The drain tuning network provides compensation for the bond wire inductors, as well as the capacitance associated with the drain of die 110. The drain tuning network includes a shunt network and a series inductance as shown in FIG. 3. Similar elements carry similar numerals. The series inductance is the result of a fifth bond wire 210 connecting the drain of die 110 to the output blocking capacitor 230. The shunt network includes a fourth bond wire inductance 120 coupled on one end to a first output capacitor 140. The fourth bond wire inductance 120 is on the other end coupled to the drain of die 110, and the first output capacitor 140 is coupled to ground on the flange 305. A fifth bond wire inductance 130 couples the first capacitor 140 with a second capacitor 150 physically placed next to capacitor 140. As discussed above, these components provide broadband matching at a predetermined load impedance, to provide a desired power level for efficient amplifier operation.

An input bias bond wire 307 is used to electrically couple the input bias terminal 350 to the gate of the die 110 via additional bond wire 308 and the second input capacitor 317. An output bias bond wire 220 is used to electrically couple the output bias terminal 170 to the drain of the die 110 via the first and second output capacitors 140, 150 and fourth and fifth bond wires 120, 130.

Figure 5:
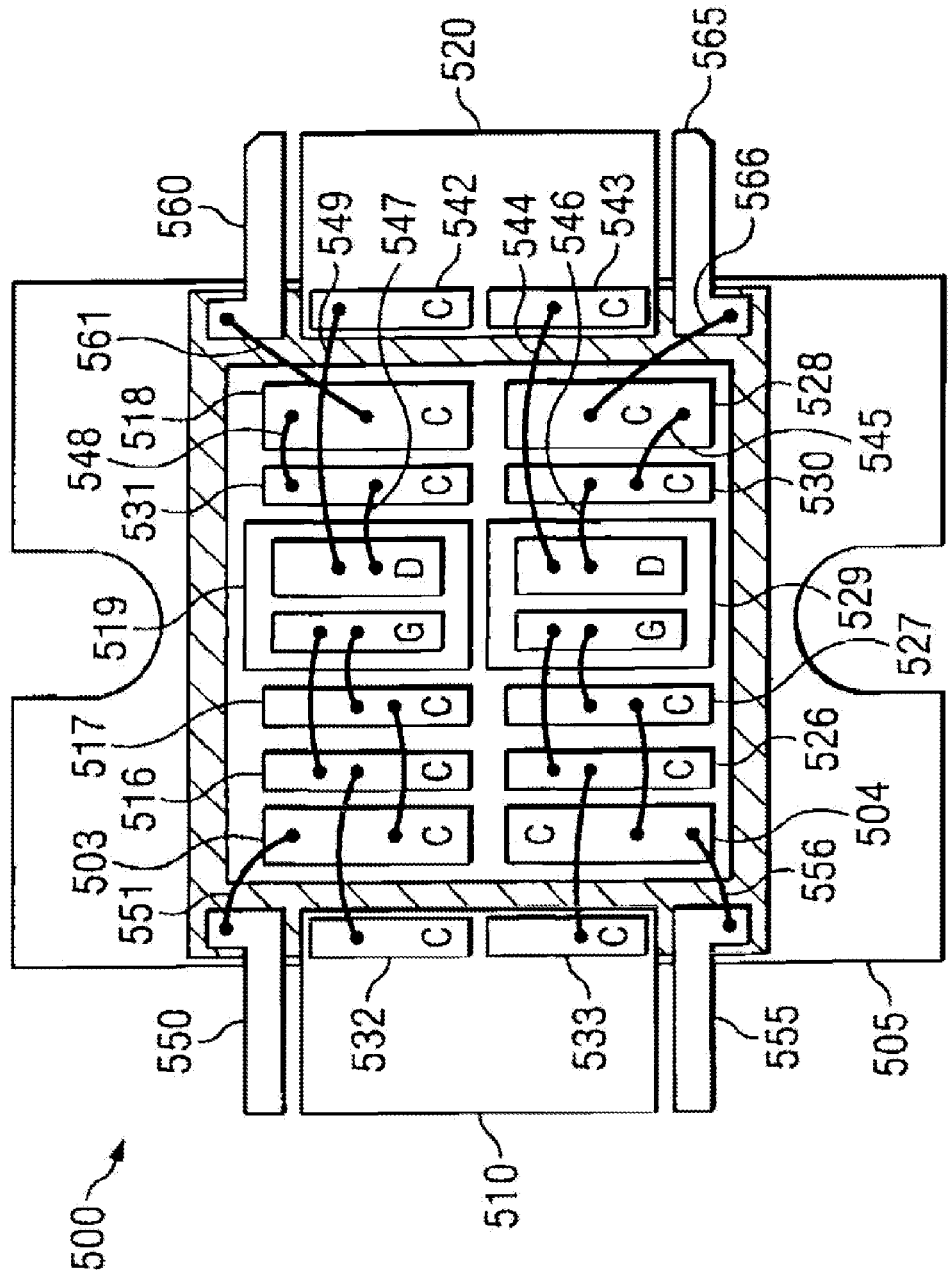
FIG. 5 is a top view of another exemplary embodiment of an LDMOS RF power transistor device.

FIG. 5 illustrates the physical configuration of an alternate form of a novel power transistor device 500 with two die circuits, similar constructed as device 300, coupled and operating in parallel. An equivalent circuit for this transistor 500 appears in FIG. 6. Transistor 500 has seven terminals: an input terminal 510, an output terminal 520, and a flange 505, a first input bias terminal 550, a second input bias terminal 555, a first output bias terminal 560, and a second output bias terminal 565.

A first die circuit has a die 519, a first gate tuning network with capacitors 516, 517, and a first drain tuning network 518, 531, 547, 548, 549, 561. A second die circuit has a die 529, a second gate tuning network with capacitors 526, 527, and a second drain tuning network 528, 530, 544, 545, 546, 566. Each die circuit functions individually as described above with transistor 300 in with FIG. 4. Within economical and practical manufacturing tolerances, the two die circuits are matched so that each die circuit shares the load approximately equally. The skilled practitioner will also appreciate that three or more die circuits can be coupled in parallel to provide additional power handling capability.

Figure 6:
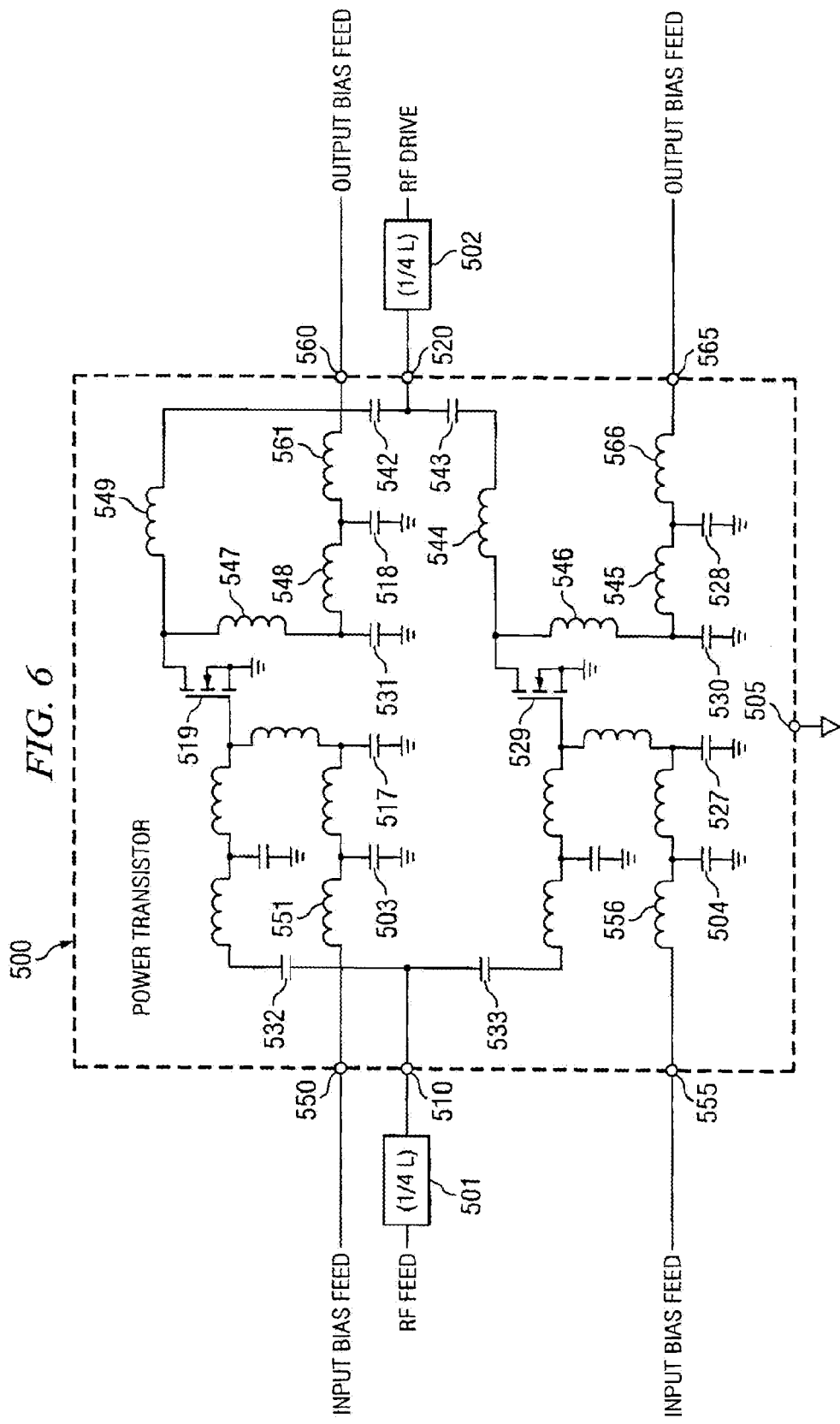
FIG. 6 is a schematic circuit diagram of the LDMOS RF power transistor device as shown in FIG. 5.

FIG. 6 shows the equivalent circuit diagram of the transistor as shown in FIG. 5. The input signal is split for both transistors 519 and 529 through a signal splitter formed by input capacitors 532 and 533 together with terminal 510. The output signals of both transistors 519 and 529 are coupled through a signal merger formed by output capacitors 542 and 543 with terminal 520. In addition, FIG. 6 shows ¼ lambda transmission lines 501 and 502 coupled with the input and output terminals 510, 520, respectively. Furthermore, output bias feeds and input bias feeds are indicated. The gain matching networks are again formed similarly to the drain matching networks, thus, comprising additional capacitors 503, 504 and inductors 551, 556, respectively.

Figure 7:
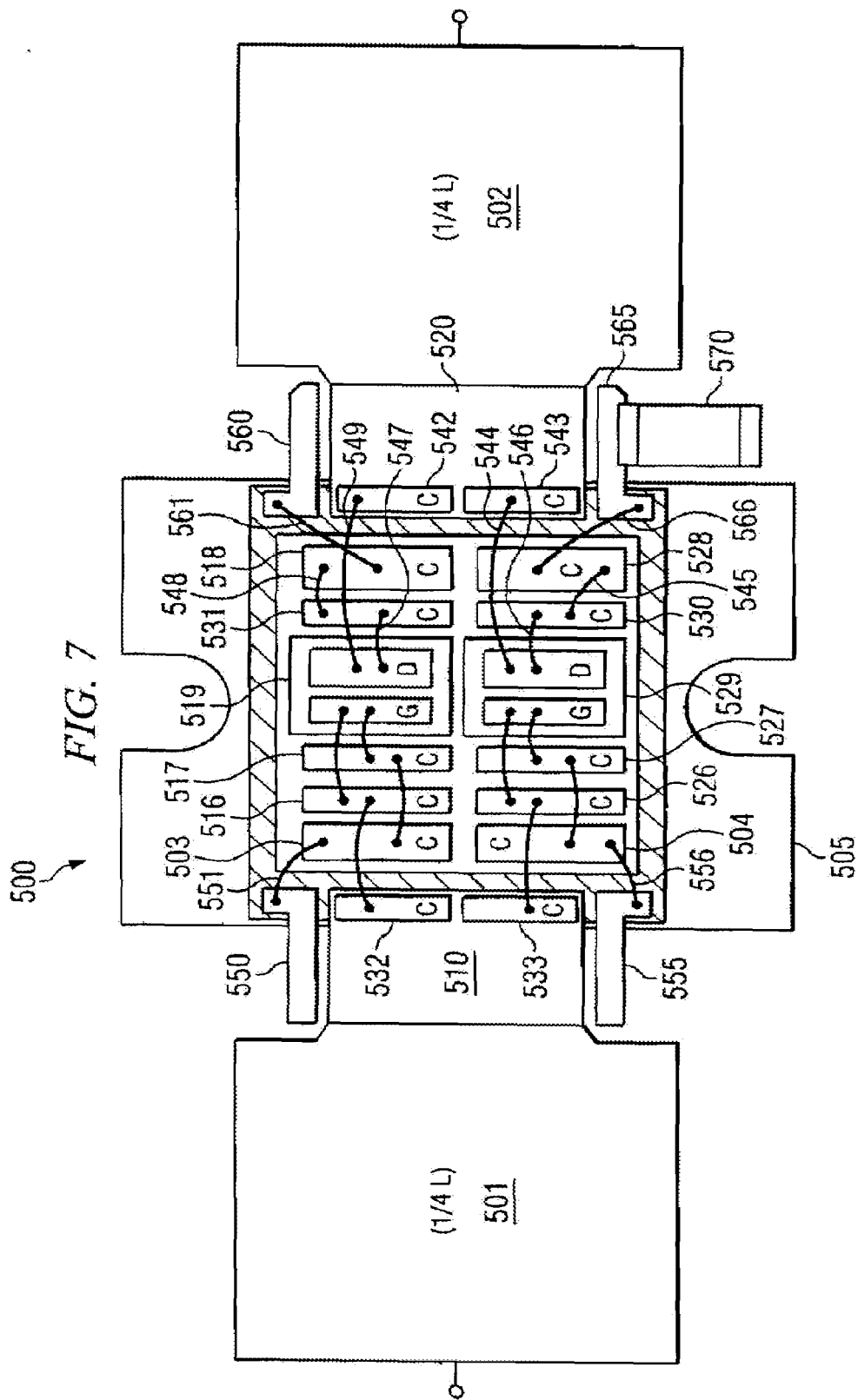
FIG. 7 illustrates the physical configuration of a broadband RF power amplifier section using the power transistor as shown in FIG. 5 and 6.

FIG. 7 shows a top view of an exemplary embodiment according to FIG. 6 similar to the shown embodiment in FIG. 5. In addition, the ¼ lambda transmission lines are attached to the input terminals 510, 520, respectively. Also, FIG. 7 shows how regular external DC blocking capacitors 570 (as shown in FIG. 1), having a value of, for example, 10 µF, can be easily attached to the bias terminals 550, 555, 560, and 565. Only a single blocking capacitor 570 coupled with bias input terminal 565 is shown in FIG. 7. The remaining terminals 550, 555, and 560 can be provided with similar capacitors.

Figure 8:
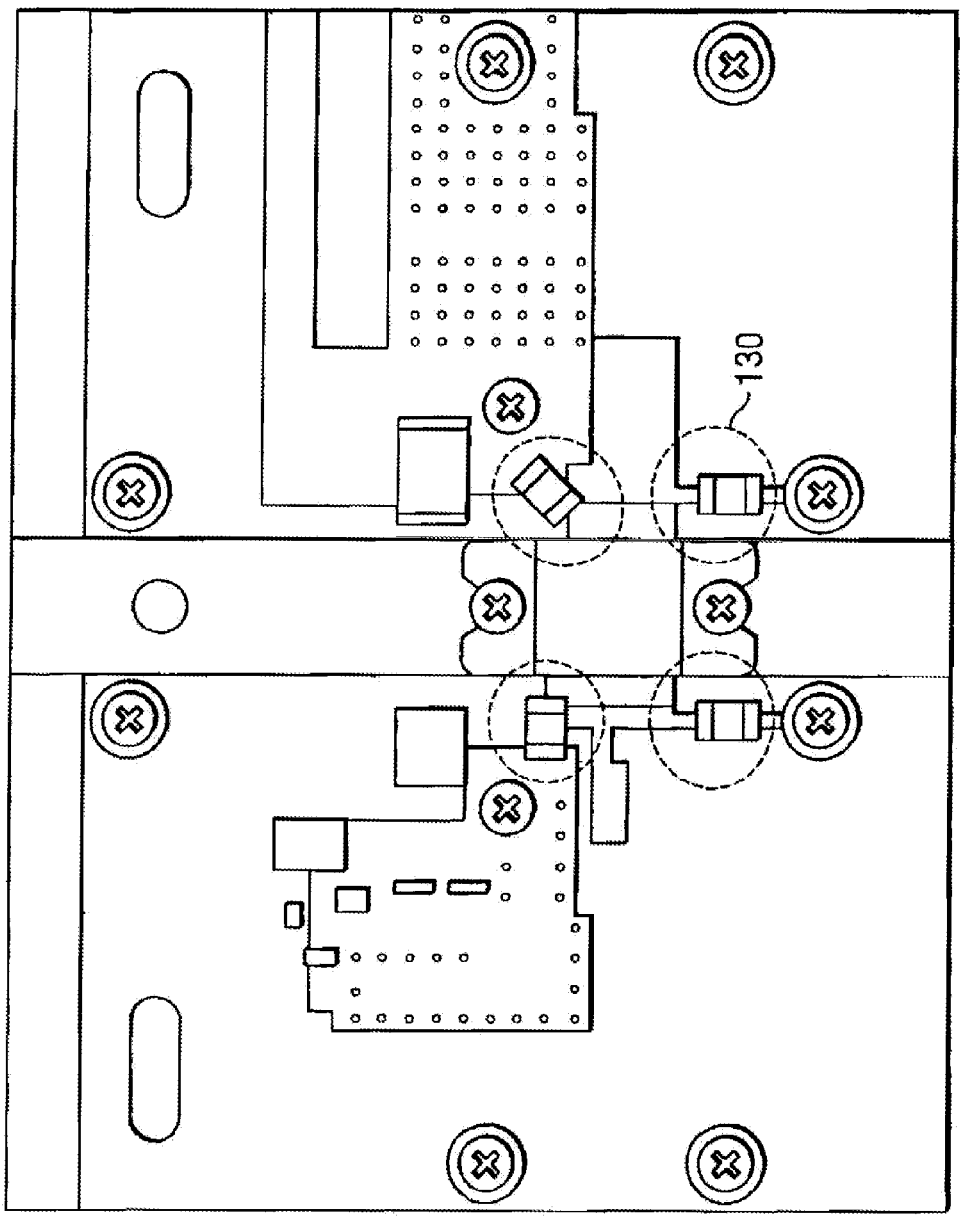
FIG. 8 is a picture of a test circuit board using the embodiment of an LDMOS RF power transistor as shown in FIG. 7.
Figure 9:
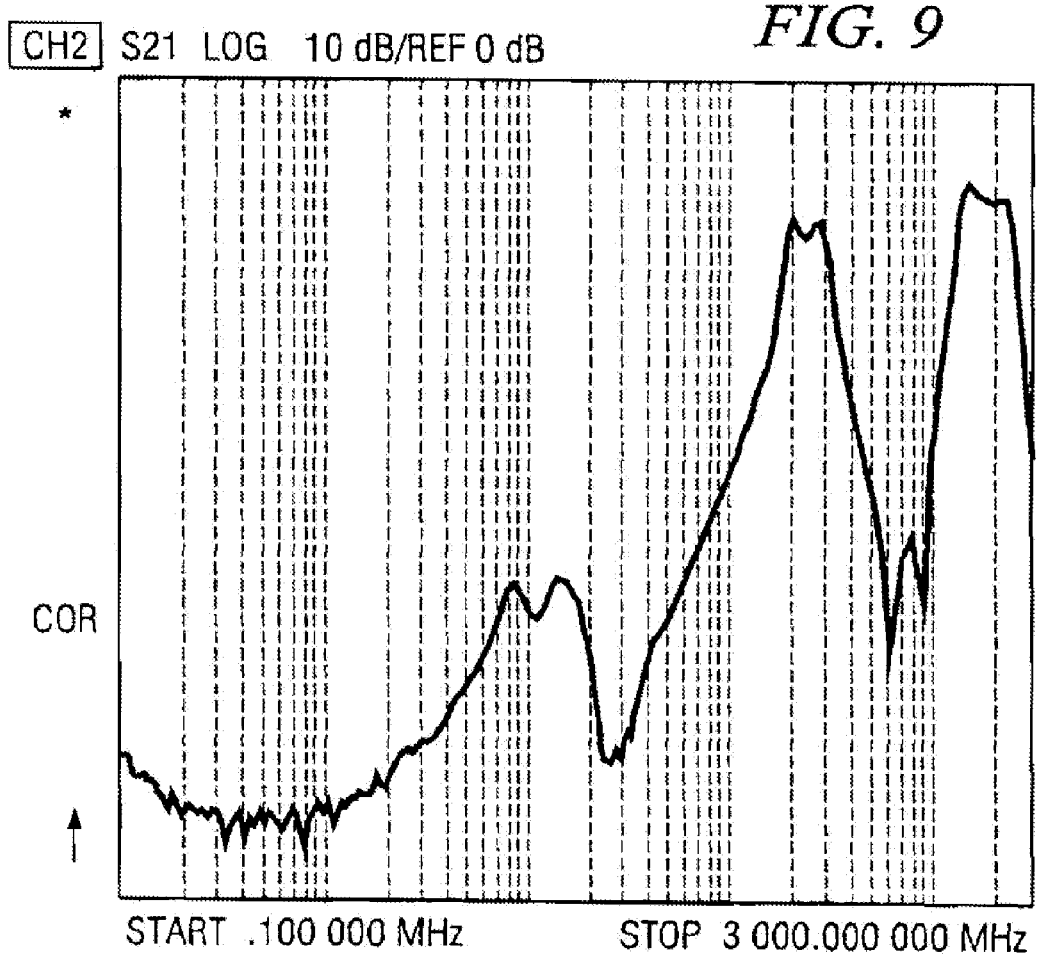
FIGS. 9-11 show diagrams depicting different wideband swept frequency response of the test board as shown in FIG. 7.

FIGS. 8 and 9 show simulations of the effective improvement of such a transistor according to FIG. 1 using a transistor package as shown in FIG. 4B of U.S. Pat. No. 6,734,728. To simulate the additional internal capacitor 150, four 10 nF capacitors are placed as closely as possible to the housing on the external terminals 550, 555, 560, and 565 as indicated by the circles in FIG. 8. The internal bond wires 551, 556, 561, and 566 will, thus, serve as the inductor 130. These bond wires have an estimated value of 1 to 1.5 nH. The additional capacitors are indicated by circles in FIG. 8. Such an arrangement is not completely optimized and can only serve as an approximation, as opposed to the arrangements shown in FIGS. 4, 5, and 7 which have placements of the additional capacitors within the housing. However, the arrangement shown in FIG. 8 already indicates the improvement in the frequency response as depicted in FIG. 9.

FIG. 9 shows a secondary gain response peak which occurs between 200 and 300 MHz at a level of about 12 dB, while the "in band" gain at 2 GHz is about 14 dB. The gain at 100 MHz is about −18 dB. The clearly visible double peak at the secondary response peak most likely arises from slight differences in inductance and/or the value of capacitor 130 on each side of the package. A much smaller third gain peak occurs between 6 and 20 MHz. This peak will be discussed below.

Figure 10:
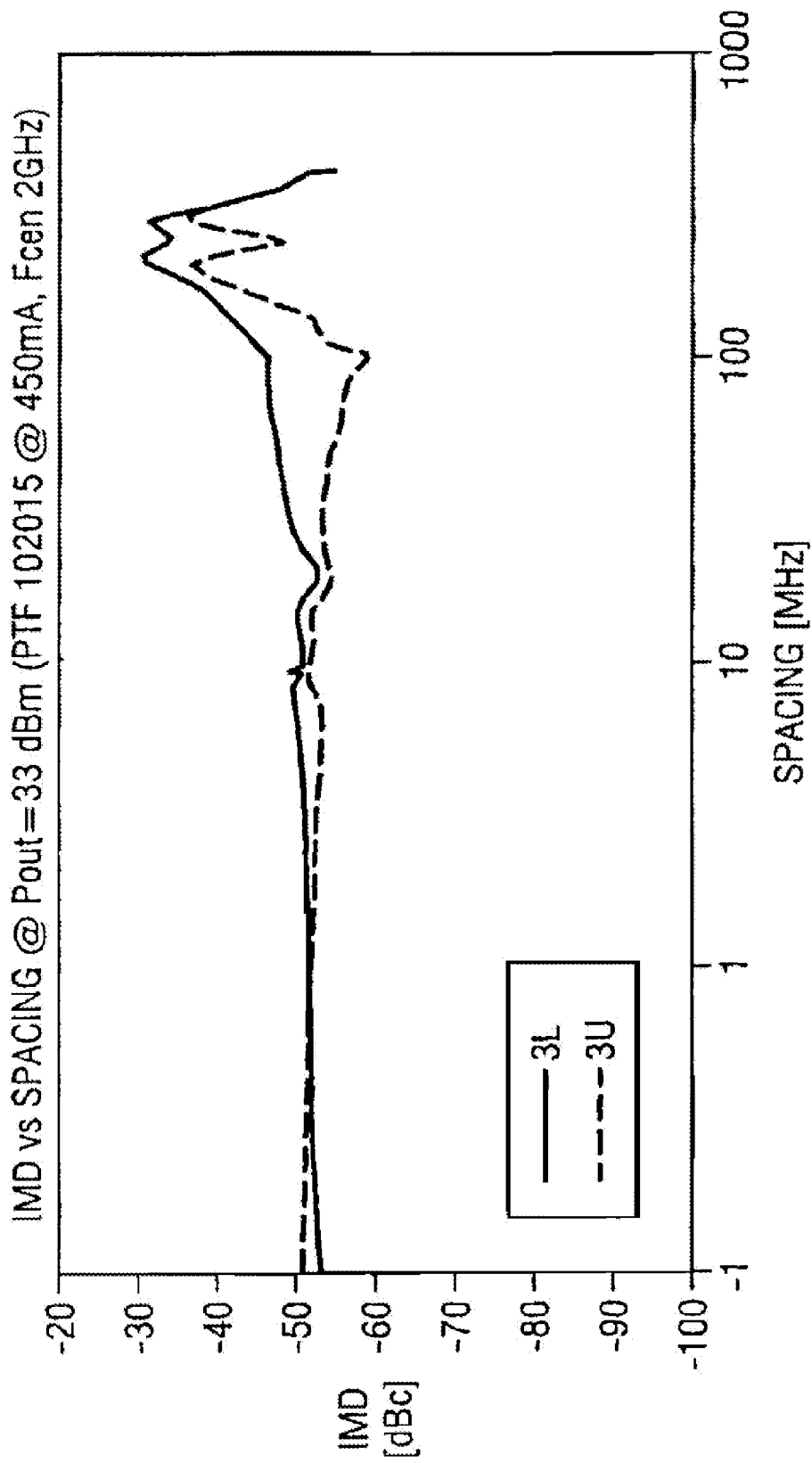

FIG. 10 shows the intermodulation distortion (IMD) behavior as a function of two-tone frequency separation. Usually lower and upper frequencies $f_1$ and $f_2$ are used to measure this distortion. As a result two main 3rd order distortion components, namely $3L=2f_1-f_2$ and $3U=2f_2-f_1$ are generated. Thus in FIG. 10, the curve marked with 3L indicates the upper 3rd order IMD product and the curve marked with 3U the lower 3rd order IMD product. Once again, the significant IMD increase coincides with the secondary gain peak between 200 and 300 MHz. Even the double peak characteristic is preserved. The region of "increase-free" IMD now extends over 100 MHz. One of the characteristic aspects of useable bandwidth is the fact that there should be a minimum of deviation of the 3rd order distortion components 3L and 3U over the whole usable frequency range. For example, an 0approximate 3 db deviation from the general IMD level as defined at lower frequencies may be used to determine the useable bandwidth. As can be seen in FIG. 10, the lower frequency distortion level for both the upper and lower IMD components is around −50 dB. A deviation of these two IMD components of approximately ±3 dB can be seen around 100 MHz. Thus, the usable bandwidth is extended to more than 100 MHz. A comparison with the characteristic of prior art amplifiers which show a useable a bandwidth of merely 40-45 MHz indicates 100% or an octave of improvement in IMD bandwidth.

This region of "increase-free" IMD bandwidth could be further improved if the inductance 130 could be reduced which can be achieved by placing the capacitor 150 inside the package physically next to capacitor 140 as shown in FIGS. 4, 5, and 7.

Figure 11:
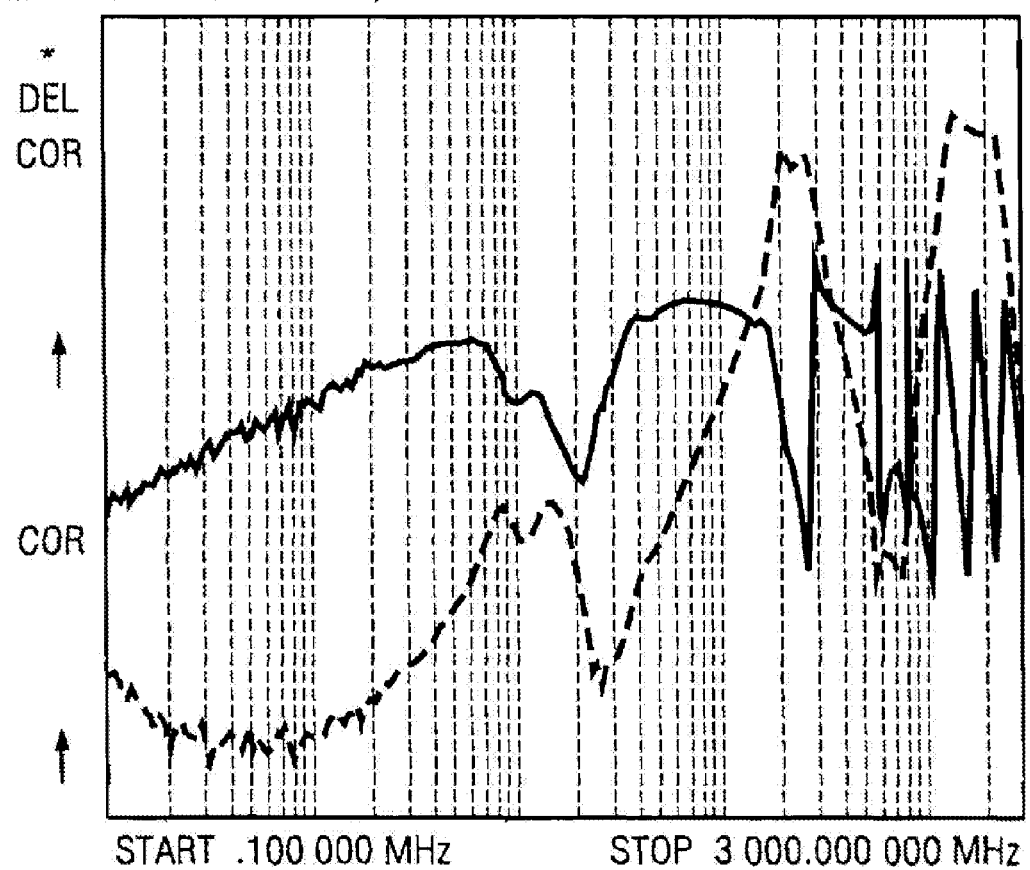

A detailed analysis of the measured IMD characteristic shown in FIG. 10 reveals small ripples occurring in the frequency range between 6 and 20 MHz. This corresponds exactly to the third gain response peak shown in FIG. 9. To expand on this issue, FIG. 11 again shows the frequency response along with the phase characteristics.

The phase response undergoes a rapid change in the 6 to 20 MHz range, indicating the presence of a resonance. Indeed, it has been verified that the large external 10 µF capacitors used in the bias circuit to filter out the low frequency components exhibits a parallel resonance in this frequency range. A person skilled in the art will appreciate to notice that these resonances occurring at very low impedance levels, as the circuit gain is reduced by several tens of dB, can impact the overall IMD characteristic by several dB. This impact is even more significant when the amplifier operates in the "IMD sweet spot", which occurs at certain power levels and bias points where the overall IMD level is lowest. The asymmetry of lower and upper IMD terms is often attributed to so-called "memory-effects." The data presented in FIG. 11 indicates that the visible asymmetry is traced to absolute value and also rapid phase change of video impedance presented to the device and established by the entire bias network.

Therefore, the present invention is well adapted to carry out the objects and attain the ends and advantages mentioned as well as those that are inherent therein. While numerous changes may be made by those skilled in the art, such changes are encompassed within the spirit of this invention as defined by the appended claims.

What is claimed is:

1. A semiconductor power device comprising:
    a flange;
    a die having a gate, a source, and a drain, wherein the source is electrically coupled to the flange;
    a drain matching circuit located on the flange having an input, an output and a bias input, the input being coupled with the drain, wherein the drain matching circuit comprises an inductor coupled in series with a first capacitor between the drain and flange and a second capacitor arranged next to the first capacitor, wherein the second capacitor is coupled with the bias input and in parallel with the first capacitor through a second inductor;
    an input terminal being mechanically coupled to the flange and electrically coupled with the gate;
    an output terminal being mechanically coupled to the flange and electrically coupled with the output of the drain matching circuit; and
    an input bias terminal being mechanically coupled to the flange and electrically coupled with the drain through the bias input.

2. The semiconductor power device as in claim 1, wherein the value of the second capacitor is large in comparison to the first capacitor and the distance between the first capacitor and the second capacitor is small, wherein a coupling bond wire creates a small inductance.

3. The semiconductor power device as in claim 1, further comprising:
    a gate matching circuit located on the flange having an input and an output, the output being coupled to the gate; and
    an input bias terminal being mechanically, coupled to the flange and electrically coupled with the gate through said gate matching circuit.

4. The semiconductor power device as in claim 1, wherein the die is a LDMOS transistor.

5. The semiconductor power device as in claim 3, wherein the gate matching network comprises two T networks and a shunt network.

6. The semiconductor power device as in claim 5, wherein the bias input terminal is coupled via a T network with the shunt network.

7. The semiconductor power device as in claim 5, wherein each T network comprises a first and second bond wire coupled in series and a capacitor coupled between the connection of the bond wires and source.

8. The semiconductor power device as in claim 3, further comprising an input blocking capacitor being electrically coupled between the input terminal and the gate.

9. The semiconductor power device as in claim 8, wherein the blocking capacitor is located on the proximal end of the input terminal.

10. The semiconductor power device as in claim 1, further comprising an output blocking capacitor being electrically coupled between the output terminal and the drain.

11. The semiconductor power device as in claim 10, wherein the blocking capacitor is located on the proximal end of the output terminal.

12. The semiconductor power device as in claim 3, wherein a plurality of dies, a plurality of gate matching circuits and a plurality of drain matching circuits is provided.

13. The semiconductor power device as in claim 1, wherein the input of the drain matching network is coupled with the output of the drain matching network through an inductor.

14. The semiconductor power device as in claim 13, wherein the inductor is formed by a bond wire.

15. The semiconductor power device as in claim 1, wherein the bias input of the drain matching network is coupled with the input bias terminal through an inductor.

16. The semiconductor power device as in claim 15, wherein the inductor is formed by a bond wire.

17. The semiconductor power device as in claim 2, wherein the first inductor has a value of about 200 pH, and the first capacitor has a value of about 200 pF, the second inductor has a value of about 100 pH, and the second inductor has a value of about 10 nF.

18. A broadband radio frequency (RF) signal amplifier, comprising:
    at least one transistor attached to a surface of a pedestal, the transistor having a RF input and a RF output,
    a bias input and a bias output;
    the pedestal comprising a support structure, reference ground and heat sink for the transistor,
    RF input path electrically connected to the transistor input,
    an input matching network configured to couple the input signal to the transistor input at an input impedance,
    an input direct current (dc) bias network configured to bias the transistor input to an input operating point,
    an RF output path electrically connected to the transistor output, and
    an output matching network configured to couple the respective component output signal to the transistor output at an output impedance, and an output dc bias networks configured to bias the transistor output to an output operating point, wherein the output dc bias network comprises an inductor coupled in series with a first capacitor between the drain and reference ground and a second capacitor arranged next to the first capacitor, wherein the second capacitor is coupled with the bias input and in parallel with the first capacitor through a second inductor.

19. The amplifier of claim 18, wherein the value of the second capacitor is large in comparison to the first capacitor and the distance between the first capacitor and the second capacitor is small, wherein a coupling bond wire creates a small inductance.

20. The amplifier of claim 18, wherein a plurality of transistors is provided on the pedestal and wherein the input path includes a splitter configured to split a RF input signal into a plurality of component input signals.

21. The amplifier of claim 20, wherein the output path includes a signal merger configured to combine component output signals received at the transistor outputs into a RF output signal.

22. The amplifier of claim 18, wherein the inductors are formed by bond wires.

23. The amplifier of claim 18, wherein the input matching network comprises a transmission line implemented in a printed circuit board and electrically connecting the component input signals to respective transistor inputs, the transmission lines having lengths, approximating one-fourth of a wavelength of a fundamental frequency of the RF input signal.

24. The amplifier of claim 18, wherein the output matching network comprises transmission lines implemented in a printed circuit board and electrically connecting component output signals to the combiner, the transmission lines having lengths approximating one-fourth of a wavelength of a fundamental frequency of the RF input signal.

25. The amplifier of claim 21, wherein the signal splitter and signal merger are passive elements.

26. The amplifier of claim 18, wherein the input impedance is relatively high, and the input operating point is relatively low.

27. The amplifier of claim 21, further comprising a first plurality of conductors electrically connecting respective input, path transmission lines to respective transistor inputs, and a second plurality of conductors electrically connecting respective output path transmission lines to respective transistor outputs.

28. A semiconductor power device comprising:
a flange;
a die having a gate, a source, and a drain, wherein the source is electrically coupled to the flange;
a gate matching circuit located on the flange having an input and an output, the output being coupled to the gate;
an input bias terminal being mechanically, coupled to the flange and electrically coupled with the gate through said gate matching circuit;
a drain matching circuit located on the flange having an input, an output and a bias input, the input being coupled with the drain, wherein the drain matching circuit comprises an inductor coupled in series with a first capacitor between the drain and flange and a second capacitor arranged next to the first capacitor, wherein the second capacitor is coupled with the bias input and in parallel with the first capacitor through a second inductor, and wherein the value of the second capacitor is large in comparison to the first capacitor and the distance between the first capacitor and the second capacitor is small, wherein a coupling bond wire creates a small inductance;
an input terminal being mechanically coupled to the flange and electrically coupled with the gate;
an output terminal being mechanically coupled to the flange and electrically coupled with the output of the drain matching circuit; and
an input bias terminal being mechanically coupled to the flange and electrically coupled with the drain through the bias input.

29. The semiconductor power device as in claim 28, wherein the gate matching network comprises two T network and a shunt network.

30. The semiconductor power device as in claim 29, wherein the bias input terminal and the is coupled with the respective shunt network.

31. The semiconductor power device as in claim 29, wherein each T network comprises a first and second bond wire coupled in series and a capacitor coupled between the connection of the bond wires and source.

32. The semiconductor power device as in claim 28, further comprising an input blocking capacitor being electrically coupled between the input terminal and the gate.

33. The semiconductor power device as in claim 32, wherein the blocking capacitor is located on the proximal end of the input terminal.

34. The semiconductor power device as in claim 28, further comprising an output blocking capacitor being electrically coupled between the output terminal and the drain.

35. The semiconductor power device as in claim 34, wherein the blocking capacitor is located on the proximal end of the output terminal.

36. The semiconductor power device as in claim 28, wherein a plurality of dies, a plurality of gate matching circuits and a plurality of drain matching circuits is provided.

37. The semiconductor power device as in claim 28, wherein the input of the drain matching network is coupled with the output of the drain matching network through an inductor.

38. The semiconductor power device as in claim 37, wherein the inductor is formed by a bond wire.

39. The semiconductor power device as in claim 28, wherein the bias input of the drain matching network is coupled with the input bias terminal through an inductor.

40. The semiconductor power device as in claim 39, wherein the inductor is formed by a bond wire.

41. The semiconductor power device as in claim 28, wherein the first inductor has a value of about 200 pH, and the first capacitor has a value of about 200 pF, the second inductor has a value of about 100 pH, and the second inductor has a value of about 10 nF.

* * * * *